US012683427B2

(12) United States Patent
McComas et al.

(10) Patent No.: US 12,683,427 B2
(45) Date of Patent: Jul. 14, 2026

(54) METHOD AND SYSTEM OF DETECTION OF DROPPED LOADS RESULTING FROM AN ELECTRICAL POWER QUALITY EVENT

(71) Applicant: EATON INTELLIGENT POWER LIMITED, Dublin (IE)

(72) Inventors: Donald T. McComas, Oakdale, PA (US); Roger W. Cox, McDonald, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 588 days.

(21) Appl. No.: 18/130,191

(22) Filed: Apr. 3, 2023

(65) Prior Publication Data

US 2023/0420983 A1     Dec. 28, 2023

Related U.S. Application Data

(60) Provisional application No. 63/355,380, filed on Jun. 24, 2022.

(51) Int. Cl.
| | |
|---|---|
| *H02J 13/12* | (2026.01) |
| *G01R 11/25* | (2006.01) |
| *G01R 19/25* | (2006.01) |

(52) U.S. Cl.
CPC .............. *H02J 13/12* (2026.01); *G01R 11/25* (2013.01); *G01R 19/2513* (2013.01)

(58) Field of Classification Search
CPC ........... H02J 13/00002; H02J 13/00001; H02J 3/001; H02J 13/00026; G01R 11/25; G01R 19/2513; G01R 19/165; G01R 19/00; G01R 19/16566; G01R 21/00; G01R 31/00; G06Q 50/06
See application file for complete search history.

(56) References Cited

U.S. PATENT DOCUMENTS

2021/0165024 A1 *  6/2021  Menzel .............. G01R 19/2513

FOREIGN PATENT DOCUMENTS

| CN | 102 967 783 A | 3/2013 |
|---|---|---|
| CN | 110 137 958 A | 8/2019 |
| CN | 113 030 616 A | 6/2021 |
| EP | 3 591 788 A1 | 1/2020 |

OTHER PUBLICATIONS

Mori Ket Al: "Modeling of Electric 1-15 Apparatus for Voltage Sag Investigation in Customer Power Distribution System", Future Power Systems, 2005 International Conference On Amsterdam, The Netherlands Nov. 16-18, 2005, Piscataway, NJ, USA, IEEE, Nov. 16, 2005 (Nov. 16, 2005), pp. 1-5.
European Patent Office "extended European search report" for corresponding European Patent Application No. 23177186.6, dated Nov. 28, 2023, 9 pp.

* cited by examiner

*Primary Examiner* — Yossef Korang-Beheshti
(74) *Attorney, Agent, or Firm* — Eckert Seamans Cherin & Mellott, LLC

(57) ABSTRACT

A method of power quality monitoring includes: capturing a power quality event; determining that the captured power quality event is one of a voltage sag, a swell or an interruption; in response to determining the captured power quality event is one of the voltage sag, the swell or the interruption, selecting a pre-event interval and a post-event interval; comparing a pre-event load level and a post-event load level; and detecting a load loss based on a result of the comparison.

16 Claims, 9 Drawing Sheets

User Response to Load Loss Report

810 — Email or SMS received

820 — Inspect load loss parameters

830 — Are parameters similar to those of previous events ?

Yes

840 — Tag event(s) to match previous tag

850 — Tag event(s) with new tag according to load(s) lost

No

Stop

800

METHOD AND SYSTEM OF DETECTION OF DROPPED LOADS RESULTING FROM AN ELECTRICAL POWER QUALITY EVENT

CROSS-REFERENCE TO RELATED APPLICATION

This patent application claims the priority benefit under 35 U.S.C. § 119(e) of U.S. Provisional Application No. 63/355,380, filed on Jun. 24, 2022, the contents of which are herein incorporated by reference.

FIELD OF THE INVENTION

The disclosed concept relates generally to a method and system of power quality monitoring, and in particular, to a system and method of detecting dropped loads resulting from an electric power quality events.

BACKGROUND OF THE INVENTION

Power quality can be defined as reliability, compatibility, or the concept of powering and grounding electronic equipment in a manner that is suitable to the operation of that equipment and compatible with the premise wiring system and other connected equipment. Power quality events can be classified into seven categories: (i) transients such as impulsive and oscillatory transients, (ii) short-duration variations such as sag and swell, (iii) long-duration variations such as under voltage and overvoltage, (iv) voltage unbalance, (v) waveform distortion such as harmonics and interharmonics, (vi) voltage fluctuations, and (vii) power frequency variations.

Loads may drop when the power quality events such as a voltage sag occurs. Downtime of any critical process equipment results in operational and financial losses including loss of production and productivity. Presently, it is difficult to ascertain that certain loads have gone offline as a result of power quality events, and thus need to be restarted. For example, detecting voltage sags poses a challenge since it is difficult to predict when such sags will occur. Further, a root-cause analysis of the process interruption is often required before restarting a process, extending the duration of the interruption. Time and effort is required to identify electrical driven loads, usually machinery that have been knocked offline due to voltage sags or other disturbances. Conversely, automated notification of disturbances often results in nuisance alarms and/or email notification, thereby leaving the dropped loss unidentified and offline.

A simple method or system for detecting the occurrence of power quality events and identifying any resultant load loss that may lead to loss of production or productivity is needed.

There is room for improvement in power quality monitoring methods and systems.

SUMMARY OF THE INVENTION

These needs, and others, are met by at least one embodiment of the disclosed concept in which a method of power quality monitoring of a power quality monitoring (PQM) system including an intelligent power device coupled to a plurality of loads is provided. The method includes: capturing a power quality event occurring over a part of a plurality of time intervals each having an equal duration, the part spanning one or more time intervals; determining that the captured power quality event is one of a voltage sag, a swell or an interruption; in response to determining that the captured power quality event is one of the voltage sag, the swell or the interruption, selecting a pre-event interval including one time interval preceding the one or more time intervals and a post-event interval including one time interval following the one of more time intervals; comparing a pre-event load level measured during the pre-event interval and a post-event load level measured during the post-event interval; and detecting a load loss based on a result of the comparison.

In accordance with an example embodiment of the disclosed concept, a power quality monitoring system includes: to plurality of loads; a user device; and an intelligent power device coupled to the plurality of loads and structured to monitor power quality and energy within the power quality monitoring system, the intelligent power device including a power supply, a display, a metering device, and a controller structured to control power quality and energy monitoring by the intelligent power device, the controller including a communication device communicatively coupled to a user device and the plurality of loads and a power quality monitoring device, where the power quality monitoring device includes: (i) a load loss detector structured to: capture a power quality event occurring over a part of a plurality of time intervals each having an equal duration, the part spanning one or more time intervals; determine that the captured power quality event is one of a voltage sag, a swell or an interruption; in response to determining that the captured power quality event is one of the voltage sag, the swell or the interruption, select a pre-event interval including one time interval preceding the one or more time intervals and a post-event interval including one time interval following the one of more time intervals; compare a pre-event load level measured during the pre-event interval and a post-event load level measured during the post-event interval; and detect a load loss based on a result of the comparison; (ii) a power quality event report generator structured to generate a power quality event report including at least one of the captured power quality event, a detected load loss, and load loss parameters associated with the captured power quality event and transmit the power quality event report including the captured power quality event, the detected load loss, and load loss parameters associated with the captured power quality event to the user device via the communication device; and (iii) a look-up table structured to store a plurality of data for use in the power quality and energy monitoring and be accessible by a user for at least one of viewing any of the plurality of data or categorizing the captured power quality event via at least the user device.

BRIEF DESCRIPTION OF THE DRAWINGS

A full understanding of the invention can be gained from the following description of the preferred embodiments when read in conjunction with the accompanying drawings in which.

DESCRIPTION OF THE INVENTION

Figure 1:
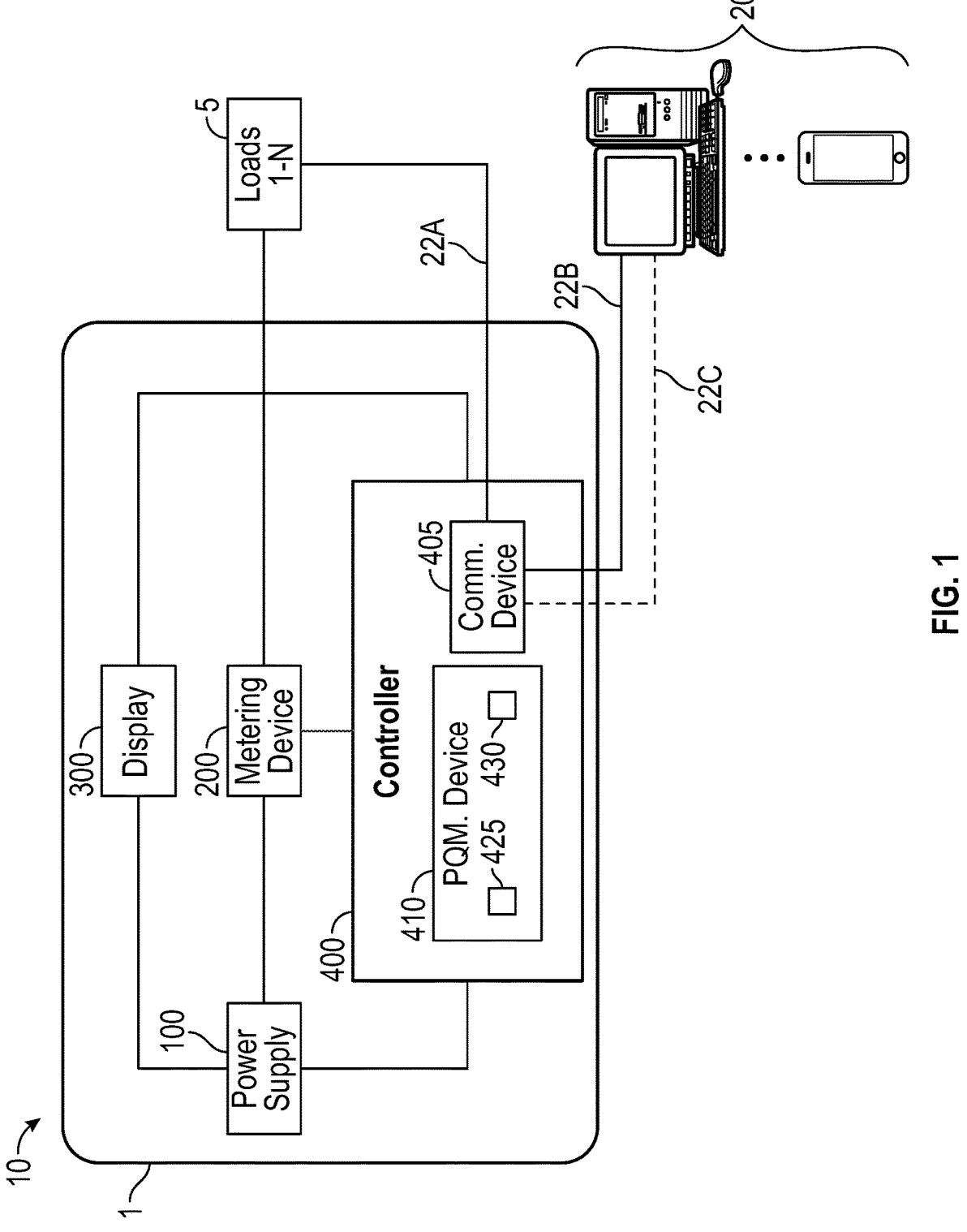
FIG. 1 is a diagram of a power quality monitoring system in accordance with an example embodiment of the disclosed concept.

Directional phrases used herein, such as, for example, clockwise, counterclockwise, left, right, top, bottom, upwards, downwards and derivatives thereof, relate to the orientation of the elements shown in the drawings and are not limiting upon the claims unless expressly recited therein.

As used herein, the singular form of "a," "an," and "the" include plural references unless the context clearly dictates otherwise.

As used herein, the term "number" shall mean one or an integer greater than one (i.e., a plurality).

Most frequent power quality events include voltage sags and swells, harmonic, transients, and voltage and current unbalance. A voltage sag is a reduction in voltage magnitude, typically between 10 and 90% of the voltage for more than 8 milliseconds and less than a minute, and may occur as a result of system faults, energization of heavy loads, starting of large inductive loads, or naturally occurring phenomenon such as lightning. Harmonics are multiples of a fundamental frequency and devices that conduct current for less than the entire voltage sine wave are non-linear loads, and thus generate harmonic voltage distortion, resulting in increased current and heat, decrease in load (e.g., a motor) efficiency, and shortened load life. Transients are momentary excursions of voltage above the normal sine wave, caused typically by capacitor switching, current interruptions, power electronics operation, arc welding, etc. When transient voltages exceed electrical insulation ratings, they may result in abrupt failure of the equipment, puncture a semi-conductor junction, etc. Voltage unbalance is voltage differences between the phases of a three-phase system, and degrades the performance and shortens the life span of the motors. The voltage unbalance may also cause high current unbalance, which may result in torque pulsation, increased vibration and mechanical stress, increased losses, motor overheating, etc.

In some examples, loads may drop when the power quality events such as a voltage sag occurs. Downtime of any critical process equipment results in operational and financial losses including loss of production and productivity. Presently, it is difficult to ascertain that certain loads have gone offline as a result of power quality events, and thus need to be restarted. For example, it is difficult to predict when a power quality event such as voltage sags will occur. Further, a root-cause analysis of the process interruption is often required before restarting a process, extending the duration of the interruption. Time and effort is required to identify electrical driven loads, usually machinery that have been knocked offline due to voltage sags or other disturbances. Conversely, automated notification of disturbances often results in nuisance alarms and/or email notification.

Example embodiments of the disclosed concept address these issues. For example, the power quality monitoring (PQM) methods and systems in accordance with the present disclosure analyze power quality event waveforms to detect any load loss (e.g., identifying a decrease in load levels) by comparing load levels of metered loads for a predefined period (e.g., 200 milliseconds) before and after an electrical power quality event. The difference between the minimum and maximum load in, e.g., without limitation, the 0.5 seconds prior to the power quality event may be used to establish the tolerance of load variation. After a settling time following the power quality event, the pre-event average is compared to the post-event average. If the difference exceeds the tolerance, a load loss is detected. The differences apply to RMS (root-means-squared) Amperes, real power (Watts), apparent power (voltage-Amperes (VA)), and reactive power (voltage-Amperes-reactive (VAR)). Changes in harmonic currents from harmonic spectrum are determined and differences in RMS rates-of-change (i.e., slope) before and after are obtained by subtracting the pre-event spectrum from the post-event spectrum to characterize the dropped load(s) (e.g., without limitations, the largest changes being the fifth and seventh harmonics). Upon characterization of the load loss, the PQM system reports the conclusions (e.g., without limitation, load(s) lost as a result of a voltage sag) in the event description in, e.g., an event log or a look-up table of the PQM system. The PQM system then transmits the power quality event report via, e.g., without limitation, email or SMS to the user (e.g., customer). Upon receipt of the power quality event report, the user labels (e.g., tags) the power quality event to categorize consequences of the power quality event (e.g., dropped ABC Compressor No. 3). As such, a tag includes identity of the dropped loss as a result of the power quality event. The user may store remotely or manually the categorization and/or the identity of the dropped load(s) in the event log or the look-up table.

If a power quality event exhibiting similar load loss parameters has already occurred, the look-up table and/or the event log already has a tag for the previously occurred power quality event. Thus, upon receipt of the power quality event report, the user may inspect the reported load loss parameters and determine whether the reported load loss parameters are similar to load loss parameters of a previous power quality event. If there are such previous load loss parameters of a previously tagged power quality event, the user then tags the instant power quality event to match the previous power quality event tag, categorizing the consequence of the instant power quality event (i.e., dropped ACB Compressor No. 3). Hence, the PQM system allows the user to receive real-time power quality event report detecting the load loss and remedy the situation (e.g., restarting the dropped load) immediately without having to engage in the lengthy root-cause diagnostics required by the conventional power quality monitoring system. Such real-time detection and identification of a dropped load(s) as a result of a power quality event not only eliminate the need for the lengthy root-cause diagnostics that the user needs to perform under the conventional power quality monitoring system, but in fact replace such diagnostics with simple steps of reading the power quality event report which has already identified the root-cause (e.g., a voltage sag and a dropped loss) and finding the previous power quality event tag for matching the instant power quality event, the tag including the respective consequence (e.g., identity of the dropped load). Further, for such detection and identification of a dropped load(s), the PQM system uses load loss parameters (pre-event load level and post-event load level) that are already provided by the conventional power quality monitoring systems, but not being used for such detection and identi-fication. Since the detection and identification only requires a simple comparison of the already available load loss parameters, no additional hardware needs be added to either the PQM system or any component thereof.

If a power quality event exhibiting similar load loss parameters has not already occurred, there is no previous power quality event tag to which the instant power quality event can be tagged to match. Even in this situation, the user needs not perform the lengthy diagnostic since the real-time power quality event report has already diagnosed the root-cause (e.g., a voltage sag). Further, in order to identify the dropped load(s) the user needs to simply compare the load loss parameters of the instant power quality event with the energy required for each load found in the look-up table. If only one load is dropped, the user needs to find a load that requires the load loss parameter for operation. If two or more loads are dropped, the user may find a plurality of loads whose sum of the energy required are the same or substan-tially same as the load loss parameters reported. As such, identifying the dropped load(s) by the user is made easy and simple by the PQM system. Upon identification, the user creates a new event tag for the instant power quality event according to the load(s) lost (e.g., dropped Siemens® Ultra-sound Equipment No. 2) in the event log and/or look-up table. This new tag categorizes the consequence of the instant power quality event and may be used to identify and categorize a future power quality event having the similar load loss parameters.

Therefore, the PQM system in accordance with the pres-ent disclosure provides a simple mechanism to detect a load loss and identify a dropped loss real-time using already available parameters without having to add additional hard-ware, thereby increasing efficiency and convenience, decreasing operational losses and eliminating costs required to perform conventional lengthy root-cause diagnostics. Further, the PQM system continuously expands its efficacy by allowing constant updates to its look-up table and/or event log via the user input as well as automatic updates by the system. In some examples, the power quality monitoring system may include trained machine learning algorithm to automatically identify a dropped loss, thereby affording further convenience and increased efficiency.

FIG. 1 is a schematic diagram of a power quality moni-toring system 10 in accordance with an example embodi-ment of the disclosed concept. The PQM system 10 includes an intelligent power device 1, loads 5 coupled to the intelligent power device 1, and a user device 20 communi-catively coupled to the intelligent power device 1. The intelligent power device 1 may be, e.g., without limitation, an intelligent electric meter, an intelligent circuit interrupter, or any smart power device for power quality monitoring and energy monitoring of the system 10. While FIG. 1 illustrates the intelligent power device 1 as an intelligent electric meter, in the examples in which the intelligent power device 1 is a circuit interrupter, the circuit interrupter may receive power from an AC power source, convert alternating current (AC) to a direct current (DC) power signal and power the loads 5 in one or more rooms or offices via a load conductor (not shown) as well as detecting a power quality event and identifying a load loss. The intelligent electric meter 1 is structured to receive real-time parameters of energy con-sumed by each load 5, and measure the energy consumed by the loads 5 over a time interval based on the real-time power parameters. The real-time parameters may include voltage, current, frequency, and/or power consumption readings and may be displayed as waveforms of, e.g., the voltage and current readings captured over a time interval. For example, the real-time parameters may be real power (Watts), appar-ent power (voltage-Amperes (VA)), reactive power (voltage-Amperes-reactive (VAR)), current, harmonic currents, etc. The intelligent electric meter 1 is further structured to capture a power quality event, detect a load loss based on the waveforms, report the captured power quality event, detected load loss and load loss parameters associated with the captured power quality event, and/or perform energy monitoring and management within the PQM system 10. The intelligent electric meter 1 includes a power supply 100, a metering device 200, a display 300 and a controller 400.

The power supply 100 is structured to supply DC power to components of the intelligent electric meter 1. The metering device 200 may be a metering engine structured to receive the real-time parameters of the energy consumed by each load 5, automatically read energy consumed, and calculate metering parameters based on the real-time param-eters. For example, the metering device 200 may measure line-to-line and line-to neutral voltages and calculate RMS values over, e.g., without limitation, 200 milliseconds. Addi-tionally, the metering device 200 may measure per phase and average system current, and calculate RMS values over, e.g., 200 milliseconds. Further, the metering device 200 may make frequency measurements, e.g., every 200 milliseconds using phase A voltage. Furthermore, the metering device 200 may measure present power consumption (e.g., without limitation, a user demand, energy, load profile, power factor, etc.), and calculate instantaneous values including, e.g., without limitation, apparent and displacement power factor for system, apparent power for system, real power for system, reactive power for system, etc. The metering device 200 may also include a billing generator (not shown) to generate a bill for a predefined period (e.g., 28 days, 3 months, etc.) and transmit the bill to the user via the communication device 405 of the controller 200.

The display 300 may be a liquid crystal display and structured to display the real-time parameters and calculated metering parameters, including the voltage and/or current RMS values, frequency measurements, present power con-sumption measurements, trend, minimum and maximum values associated with each real-time, calculated voltage, current, frequency and/or power parameters, which may also be displayed on a display screen of the user device 20 upon its connection to the intelligent electric meter 1. The display 300 may have an option (e.g., a drop-down menu) to list all events that have occurred and display an event log or a look-up table. All events (e.g., without limitation, power quality events) that have previously occurred and are cur-rently occurring can be viewed on the display 300 as well as the display screen of the user device 20. The display 300 may include a power quality screen showing, e.g., without limitation, minimum and maximum phase threshold currents with time and date stamps.

The controller 400 includes a communication device 405, a power quality monitoring (PQM) device 410, a processor and a memory (not shown). The communication device 405 is structured to communicate with the loads 5, the user device 20, and/or utility cloud via wired (e.g., without limitation, Ethernet 22A, USB cable 22B, etc.) or wireless (e.g., Bluetooth®, WiFi, LTE, LTE-A, New Radio, etc.) connections. The communication device 405 may transmit the real-time parameters and/or calculated metering parameters, including the voltage and/or current RMS values, frequency measurements, present power consumption measurements, the trend, minimum and maximum values associated with each real-time, calculated voltage, current, frequency and/or power parameter. The communication device 405 may also transmit to the user a power quality event report, bills, an alarm indicating the power quality event, etc. via an authorized communication channel (e.g., without limitation, email, SMS, etc.).

The power quality monitoring (PQM) device 410 may be a software, a firmware, codes, or instructions configured to detect and identify any load loss (e.g., identifying a decrease in load levels) by comparing load levels of metered loads for a predefined period (e.g., 200 milliseconds) before and after an electrical power quality event. The difference between the minimum and maximum load in, e.g., without limitation, the 0.5 seconds prior to the power quality event may be used to establish the tolerance of load variation. After a settling time following the power quality event, the pre-event average is compared to the post-event average. If the difference exceeds the tolerance, a load loss is detected. The differences apply to RMS Amperes, real power (Watts), apparent power (voltage-Amperes (VA)), and reactive power (voltage-Amperes-reactive (VAR)). Changes in harmonic currents from harmonic spectrum are determined and differences in RMS rates-of-change (i.e., slope) before and after are obtained by subtracting the pre-event spectrum from the post-event spectrum to characterize the dropped load(s) (e.g., without limitations, the largest changes being the fifth and seventh harmonics). Upon characterization of the load(s) lost, the PQM device 410 reports the conclusions (e.g., without limitation, load(s) lost as a result of a voltage sag) in the event description in, e.g., an event log 425 of the PQM device 410. The PQM device 410 then transmits the power quality event report via, e.g., without limitation, email or SMS to the user (e.g., customer). Upon receipt of the power quality event report, the user labels (e.g., tags) the reported load loss parameters to categorize consequences of the power quality event (e.g., dropped ABC Compressor No. 3), and thus identify the dropped loss as a result of the power quality event. The user may store remotely the categorization and/or the identity of the dropped load(s) in the event log 425 or a look-up table 430 of the PQM device 410.

If a power quality event exhibiting similar load loss parameters has already occurred and been tagged, the look-up table 430 and/or the event log 425 already has a tag for the previously occurred power quality event, the load loss parameters then have already been previously tagged. Thus, upon receipt of the power quality event report, the user may inspect the reported load loss parameters and determine whether the reported load loss parameters are similar to load loss parameters of previous power quality event reported. If there are such previous load loss parameters of a previously tagged power quality event, the user then tags the instant power quality event to match the previous power quality event tag, categorizing the consequence of the instant power quality event (i.e., dropped ACB Compressor No. 3). Hence, the PQM device 410 permits the user to receive real-time power quality event report detecting the dropped loss and enable the user to remedy the situation (e.g., restarting the dropped load) immediately based on the report without having to engage in the lengthy root-cause diagnostics required by the conventional power quality monitoring system. Such real-time detection and identification of a dropped load(s) as a result of a power quality event not only eliminate the need for the lengthy root-cause diagnostics that the user needs to perform under the conventional power quality monitoring system, but in fact replace such diagnostics with simple steps of reading the power quality event report which has already identified the root-cause (e.g., a voltage sag and a dropped loss) and finding the previous power quality event tag for matching the instant power quality event, the tag including the consequence (e.g., identity of the dropped load). Further, for such detection and identification of a dropped load(s), the PQM device 410 uses load loss parameters (pre-event load level and post-event load level) that are already by the conventional power quality monitoring systems, but not being used for such detection and identification. Since the detection and identification only requires a simple comparison of the already available load loss parameters, no additional hardware needs be added to either the PQM device 410 or any component thereof.

If a power quality event exhibiting similar load loss parameters has not already occurred, there is no previous power quality event tag to which the instant power quality event can be tagged to match. Even in this situation, the user needs not perform the lengthy diagnostic since the real-time power quality event report has already diagnosed the root-cause (e.g., a voltage sag). Further, in order to identify the dropped load(s) the user needs to simply compare the load loss parameters of the instant power quality event with the energy required for each load found in the look-up table. If only one load is dropped, the user needs to find a load that requires the lost amount of energy. If two or more loads are dropped, the user may find a plurality of loads whose sum of the energy required is the same or substantially same as the load loss amount reported. As such, identifying the dropped load(s) by the user is made easy and simple by the PQM system. Upon identification, the user creates a new event tag for the instant power quality event according to the load(s) lost (e.g., dropped Siemens® Ultrasound Equipment No. 2) in the event log and/or look-up table. This new tag categorizes the consequence of the instant power quality event and may be used to identify and categorize a future power quality event having the similar load loss parameters.

Therefore, by providing a simple mechanism to detect a load loss and identify a dropped loss real-time using already available parameters without having to add additional hardware, the PQM device 410 increases efficiency, decreases operational and/or financial losses, and eliminates extended interruption time and costs required to perform conventional lengthy root-cause diagnostics. Further, the PQM device 410 continuously expands its application and usefulness by, e.g., allowing the user to view and enter information including newly detected event tags with details and consequence in its look-up table and/or event log via the user input as well as automatic updates by the device 410 itself. In some examples, the PQM device 410 may include trained machine learning algorithm to, e.g., without limitation, automatically identify a dropped loss, thereby affording further convenience and increased efficiency. The machine learning algorithm may be trained by the user and/or the operator of the power quality monitoring system, and updated via the utility cloud wirelessly (e.g., WiFi, LTE, LTE-A, New Radio, etc.) or by plugging in a hardware storage device (e.g., a USB drive).

The processor may be, for example and without limitation, a microprocessor, a microcontroller, or some other suitable processing device or circuitry. The memory can be any of one or more of a variety of types of internal and/or external storage media such as, without limitation, RAM, ROM, EPROM(s), EEPROM(s), FLASH, and the like that provide a storage register, i.e., a machine readable medium, for data storage such as in the fashion of an internal storage area of a computer, and can be volatile memory or nonvolatile memory. The memory may include a software device via which the intelligent electric meter 1 can be configured with parameters such as time duration, a storing medium, a communication channel for power quality event monitoring, billing function, generating and transmitting a power quality event report to the user, and/or updating the look-up table based on a user input identifying the dropped loss. The software can be installed or loaded to the intelligent electric meter 1 from the utility cloud or a storage device (e.g., a USB drive). The software device is capable of monitoring energy data for the loads 5 and operate continuously on the intelligent electric meter 1.

Figure 2:
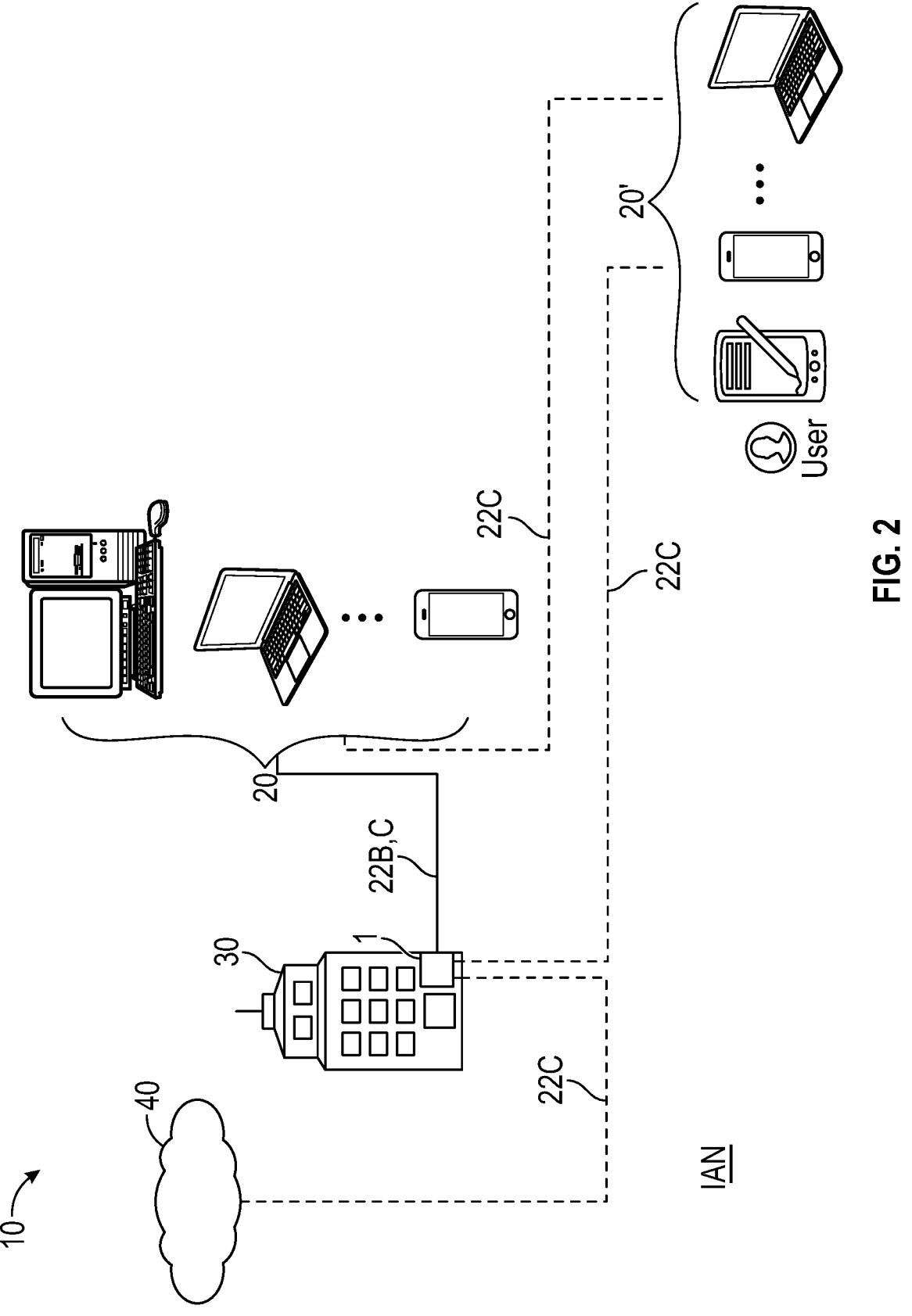
FIG. 2 is a diagram of a power quality monitoring system in accordance with an example embodiment of the disclosed concept.

FIG. 2 is a diagram of a PQM system 10 in accordance with an example embodiment of the disclosed concept. The PQM system 10 includes an intelligent power device 1 as described with reference to FIG. 1, user devices 20, 20', an industrial complex 30, and utility cloud 40. In the example embodiment shown in FIG. 2, the intelligent power device 1 is operating in an industrial complex 30. However, this is for illustrative purposes only and the intelligent power device 1 may be used to monitor power quality and energy for any other entities (e.g., an office building, a plant, a laboratory, etc.). The intelligent power device 1 operates and includes the same components as described with reference to FIG. 1, and thus, any overlapping description of the intelligent power device 1 is omitted for brevity. The intelligent power device 1, e.g., the intelligent electric meter 1, is communicatively coupled to a user device 20 in a LAN via wired (e.g., USB cables 22B) or wireless (Bluetooth®, WiFi, LTE, LTE-A, New Radio, etc.) connections. The user device 20' may also be coupled to another user device 20' in an IAN (Internet Area Network) if the end-user is not an on-site or near on-site operator of the intelligent power device 1 and receives communications via wireless connection 22C (LTE, LTE-A, New Radio, etc.) from the user device 20 for power quality and energy monitoring. The user may manually or remotely access the intelligent power device 1 and control and monitor the power quality and energy within the PQM system 10.

Figure 3:
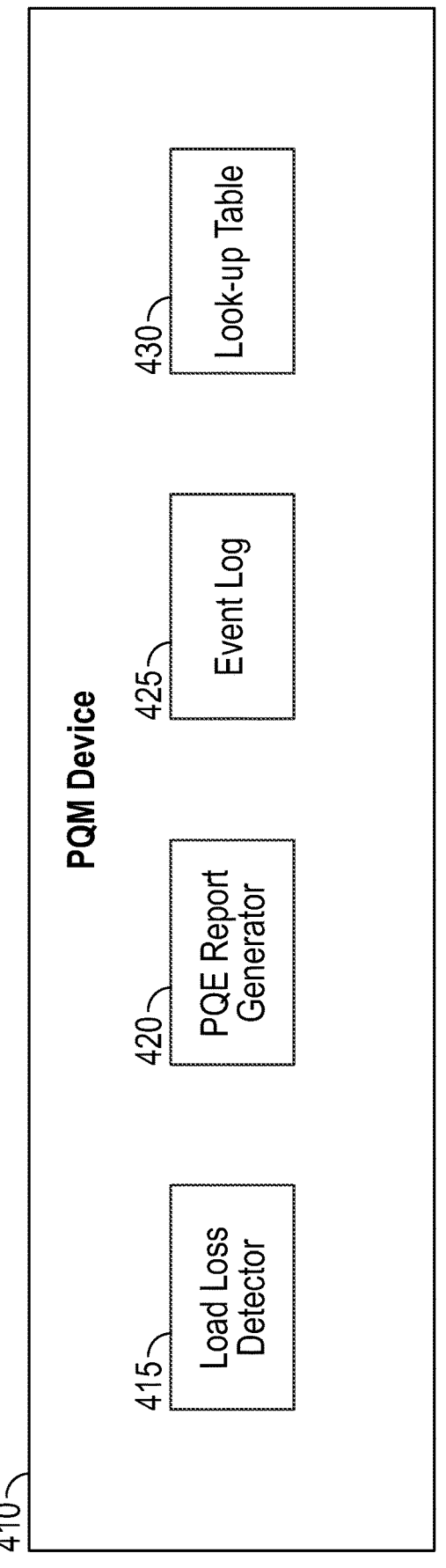
FIG. 3 is a block diagram of a controller of a power quality monitoring system in accordance with an example embodiment of the disclosed concept.

FIG. 3 is a block diagram of a power quality monitoring (PQM) device 410 in accordance with an example embodiment of the disclosed concept. The PQM device 410 may be a firmware, software, codes, or instruction configured to, e.g., without limitation, capture a power quality event, detect a load loss, and transmit a power quality event report to the user. The PQM device 410 includes a load loss detector 415, PQE report generator 420, an event log 425, and a look-up table 430. The load loss detector 415 is structured to capture a power quality event occurring over a part of a plurality of time intervals each having an equal duration, the part spanning one or more time intervals; determine that the captured power quality event is one of a voltage sag, a swell or an interruption; in response to determining that the captured power quality event is one of the voltage sag, the swell or the interruption, select a pre-event interval including one time interval preceding the one or more time intervals and a post-event interval including one time interval following the one of more time intervals; compare a pre-event load level measured during the pre-event interval and a post-event load level measured during the post-event interval; detect a load loss based on a result of the comparison. In comparing the pre-event load level measured during the pre-event interval and a post-event load level measured during the post-event interval, the load loss detector is further structured to: establish a load variation tolerance using a load level measured over at least one time interval preceding the one or more time intervals; obtain a difference between the pre-event load level and the post-event load level; and determine that the difference exceeds the established load variation tolerance. In obtaining the difference between the pre-event load level and the post-event load level, the load loss detector 415 is further structured to subtract the post-event load level from the pre-event load level, and where the detecting the load loss based on the result of the comparison is based on a determination that the difference exceeds the established load variation tolerance. The load loss parameters included in the power quality event report includes voltage-Ampere (VA) load loss, current load loss, harmonic load loss, Watt load loss, and VA-reactive (VAR) load loss. The established load variation tolerance includes voltage-Ampere (VA) load variation tolerance, current load variation tolerance, harmonic load variation tolerance, Watt load variation tolerance, and VA-reactive (VAR) load variation tolerance.

In detecting the load loss based on the result of the comparison, the load loss detector 415 is structured to determine that VA load loss has occurred if a difference between pre-event VA measured during the pre-event interval and post-event VA measured during the post-event interval exceeds the VA load variation tolerance; determine that a current load loss occurred based on a determination that the VA load loss has occurred and a determination that a difference between pre-event current measured during the pre-event interval and post-event current measured during the post-event interval exceeds the current load variation tolerance; determine a plurality of largest pre-event harmonic currents and corresponding post-event harmonic currents and determine whether any of differences between the pre-event harmonic currents and corresponding post-event harmonic currents is greater than the harmonic load variation tolerance including a percentage of determined current load loss; upon determining whether any of differences between the pre-event harmonic currents and corresponding post-event harmonic currents is greater than the harmonic current load variation tolerance, determine that a Watt load loss has occurred if a difference between pre-event Watt measured during the pre-event interval and post-event Watt measured during the post-event interval exceeds the Watt load variation tolerance; and upon determining that a Watt load loss has occurred, determine that a VAR load loss has occurred if a difference between pre-event VAR measured during the pre-event interval and post-event VAR measured during the post-event interval exceeds the VAR load variation tolerance. The VA load variation is up to 1% of VA load level measured during a time interval in which the VA load variation tolerance is established. The difference is representative of the VA loss during the captured power quality event. The captured power quality event and the VA load loss are reported. The current load loss is reported. The harmonic current load variation tolerance is up to 10% of the current load loss. Upon determination that any of the harmonic losses is greater than the harmonic load variation tolerance, the harmonic load loss is reported.

The PQE report generator 420 is structured to generate the power quality event report including at least the captured power quality event, the detected load loss and load loss parameters associated with the captured power quality event, and transmit a power quality event report to the user via the communication device 405. The load loss parameters include the VA load loss, current load loss, harmonic current load loss, Watt load loss, and VAR load loss determined by the load loss detector 415. A user input including a tag for the captured power quality event is received by at least one of the event log 425 or the look-up table 430 via the communication device 405. The tag may match a tag of a previous power quality event exhibiting load loss parameters that are similar to the load loss parameters of the captured power quality event. Upon receipt of the PQE report, the user inspects at least the load loss parameters associated with the captured power quality event; and categorizes the captured power quality event in at least one of a look-up table 430 or an event log 425 within the intelligent power device 1. In categorizing the captured power quality event, the user determines whether the load loss parameters associated with the captured power quality event are similar to load loss parameters of a previous power quality event; and if the load loss parameters associated with the captured power quality event are similar to the load loss parameters of the previous power quality event, tagging the captured power quality event to match a tag for the previous power quality event, and entering the tagging into at least one of the look-up table or the event log, where the tag for the previous power quality event includes a consequence of the previous power quality event and the consequence includes identity of a load lost as a result of the previous power quality event; or if the load loss parameters associated with the captured power quality event are not similar to the load loss parameters of the previous power quality event, generating a new tag for the captured power quality event according to the detected load lost and entering the new tag into at least one of the look-up table 430 or the event log 425.

The event log 425 is structured to capture and describe occurrence of all events including power quality events associated with the PQM system 10. The event log 425 creates an entry for each event with details and consequences of the event with date and time stamps, and stores them in the memory. The entry may be a tag categorizing each event in accordance with the event details and/or consequences. The event log 425 may be displayed on the display 300 or display screen of the user device 20,20' with an option for the user to select viewing of a particular event. As such, the event log 425 is accessible by the user manually or remotely via the user device 20,20' and constantly updated with new events occurring automatically and/or by the user.

The look-up table 430 may store a plurality of data for use in the power quality and energy monitoring and be accessible by a user for at least one of viewing any of the plurality of data or categorizing the captured power quality event via at least the user device. The look-up table is accessed by the user for categorizing the captured power quality event based on a determination whether the load loss parameters associated with the captured power quality event are similar to load loss parameters of a previous power quality event; and if the load loss parameters associated with the captured power quality event are similar to the load loss parameters of the previous power quality event, the captured power quality event is tagged by the user to match a tag fort the previous power quality event, and the tagging is entered into the look-up table 430 or the event log 425, where the tag for the previous power quality event includes a consequence of the previous power quality event and the consequence includes identity of a load lost as a result of the previous power quality event; or if the load loss parameters associated with the captured power quality event are not similar to the load loss parameters of the previous power quality event, a new tag for the captured power quality event is generated according to the detected load lost and the new tag is entered into the look-up table 425. The data include all tags generated by the user and/or the PQM device 410 for corresponding power quality events that have occurred. Tags include time and date, details and consequences of each power quality event. Details include load loss parameters, identity of loads lost as a result of each power quality event. A new power quality event detected may be tagged to match a tag of an existing tag of a previous power quality event exhibiting the same or similar load loss parameters. In such case, the identity of the dropped loss as a result of the new power quality event is the same as the identity of the dropped loss included in the tag of the previous power quality event. The look-up table 430 may also include data regarding each load's energy requirement. As such, if a new power quality whose load loss parameters are not same or similar to the existing load loss parameters of a previous power event, the user may look up the energy requirement for each load and compare with the load loss parameters in order to deduce the identity of the dropped load. As power quality events occur at any time, the look-up table 430 is constantly updated with new events occurring automatically and/or by the user. The look-up table 430 may be displayed by the display 300 or display screen of the user device 20,20'. In such cases, the user may select each tag or event stored by typing a keyword describing the load loss parameters (e.g., without limitation, current load loss 35 amps and voltage sag, dropped ultrasound machine and voltage sag, etc.). In some examples, the PQM device 410 may include trained machine learning algorithm for PQM. Machine learning (ML), which is also referred to as artificial intelligence (AI) or multivariate analysis (MVA), can be used to distinguish two or more types of events, such as to discern the images of waveforms of a voltage sag from background waveforms or to differentiate the patterns of energy deposits of electrons from photons in physics experiments. ML can also be used in regression problems to estimate, e.g., the energy of the electron from the pattern of energy deposits. The use of such a machine learning method for uncategorized events is done in two steps. First, the training step determines the structure and parameters that optimally separate the event classification based on the characteristic variables. Once the training step is complete, the machine learning method together with the structure and parameters can evaluate the unclassified events. Second, the evaluation step either places the unclassified events into one of the classifications or gives the probability of the events of being in one of the classifications. In those examples, the look-up table 430 may include data that have been pre-evaluated and pre-processed for specific needs for event testing, and thus, is capable of classifying any power quality event based on the data.

Figure 4:
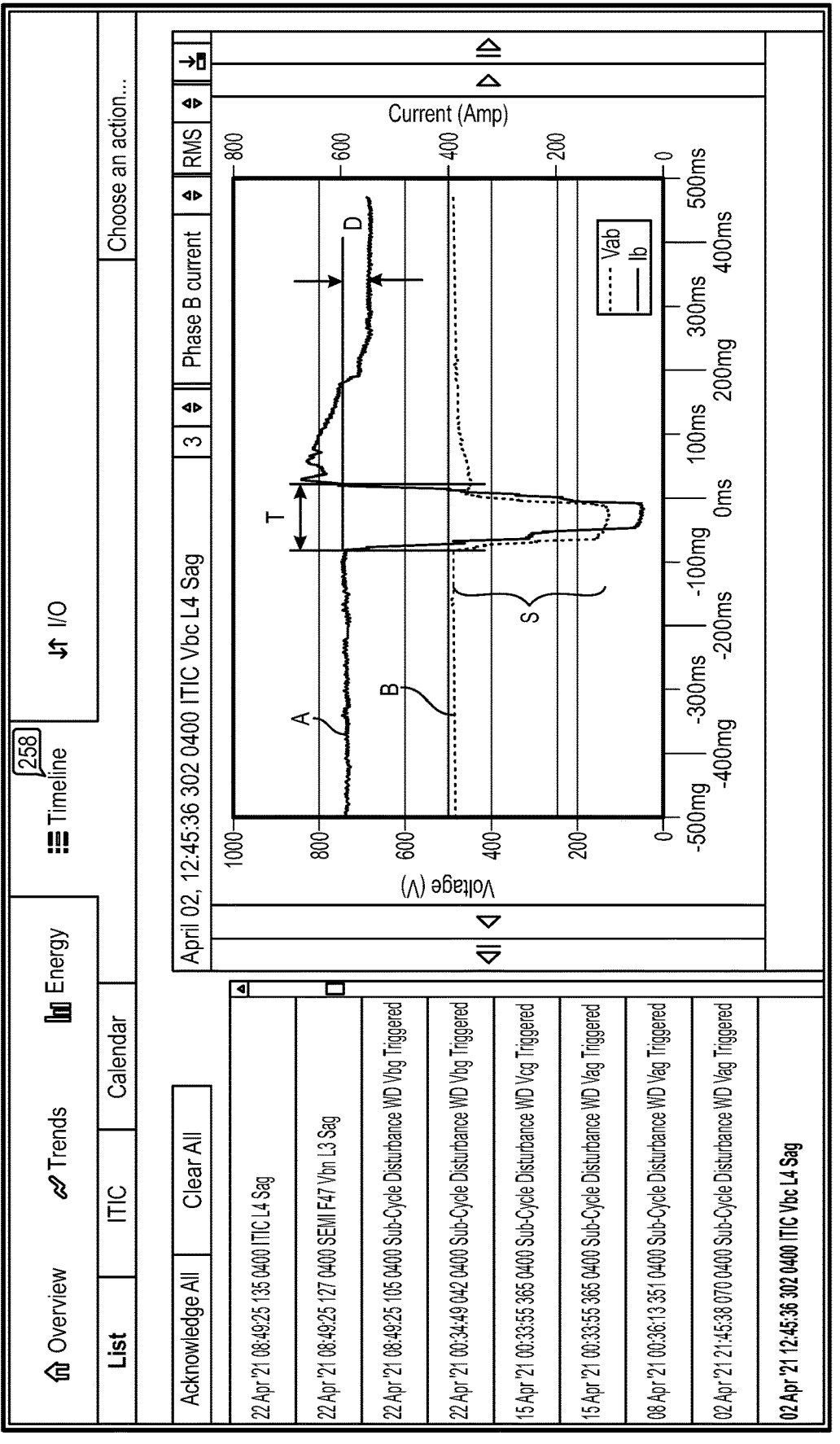
FIG. 4 illustrates waveforms capturing a power quality event in accordance with an example embodiment of the disclosed concept.

FIG. 4 illustrates waveforms capturing a power quality event in accordance with an example embodiment of the disclosed concept. The waveform is captured during a voltage sag S occurred, on e.g., Apr. 2, 2021 at 12:45:36 over a time period T during which the RMS voltage dropped about 400V. The current A has a significant dip (e.g., approximately 550 Amps during the time period T lasting about 90 ms) and, after the dip, remains reduced by approximately 35 Amp as shown by D. Based on the reduced current as shown by D, it can be deduced that a load has been lost or dropped during the voltage sag S. The intelligent electric meter 1 (particularly, PQE report generator 420) generates a power quality event report describing the voltage sag S, time and date of the occurrence, the amount of the voltage sag S, the reduced amount D of current after the voltage sag S, and the captured waveform to the user. The user may inspect the reported load loss parameters and determine whether the reported loss parameters are similar to load loss parameters of a previously tagged event(s). If so, the user views the power quality event report displayed on the user device 20, 20', determines the identity of the dropped load by looking at the look-up table 430, and immediately restarts the identified dropped load. The user then tags the reported power quality event to match the previous tagged power quality event(s) and categorize the consequence of the event in the event description of the event log 425 or the look-up table 430 (e.g., dropped ABC Compressor No. 3). If the reported loss parameters are not similar to load loss parameters of previously tagged event(s), the user identifies the load lost based on the reported loss parameters and energy requirement for each load. Upon identification of the dropped loss, the user creates a new tag in accordance with the reported load loss parameters. This new tag will be included in the event log 425 or the look-up table 430 by the user or automatic update by the PQM device 410.

Figure 5:
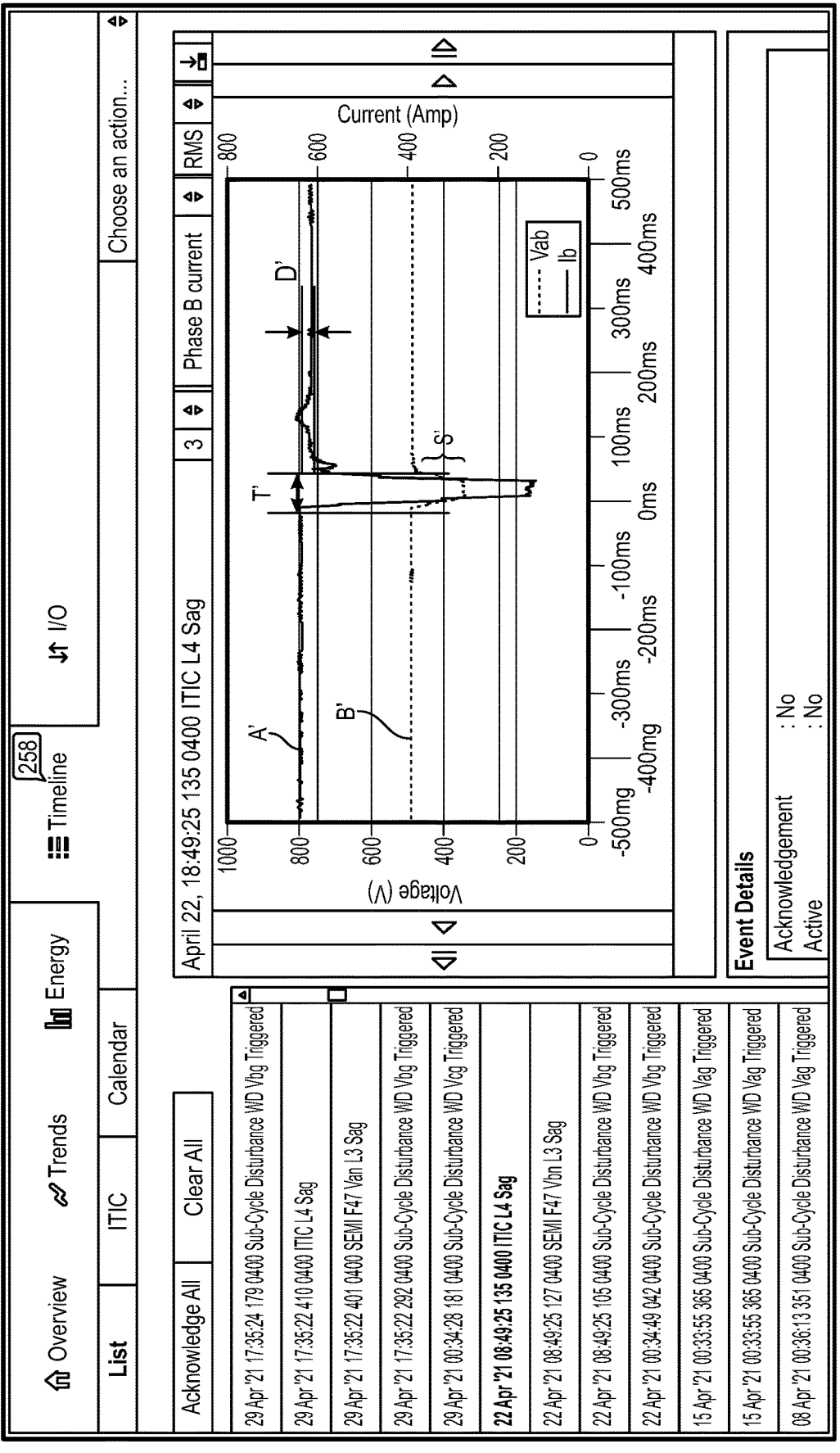
FIG. 5 illustrates waveforms capturing a power quality event in accordance with an example embodiment of the disclosed concept.

FIG. 5 illustrates waveforms capturing a power quality event in accordance with an example embodiment of the disclosed concept. FIG. 5 shows the waveforms were captured during a subsequent voltage sag S' occurring on Apr. 22, 2021 at 08:49:25. The voltage sag S' exhibits much smaller parameters than those of the voltage sag S as described with reference to FIG. 4. As such, the dropped loss is a load requiring much less energy for operation (e.g., a TV).

Figure 6:
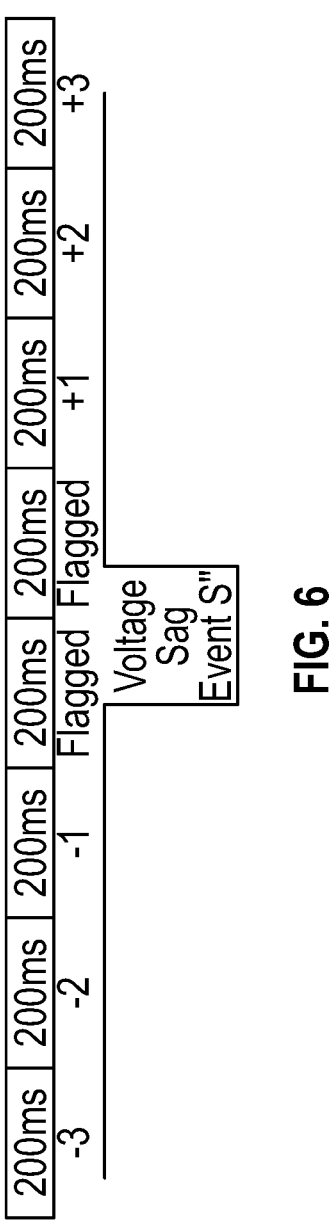
FIG. 6 is a power quality event captured in accordance with an example embodiment of the disclosed concept.

FIG. 6 illustrates a captured power quality event in accordance with an example embodiment of the disclosed concept. FIG. 6 shows a voltage sag event S" occurring over two flagged intervals, 3 pre-event intervals and 3 post-event intervals, each interval lasting 200 ms. As the PQM device 410 captures a power quality event, RMS and FFT (fast Fourier transform) intervals are flagged. The PQM device 410 then selects a pre-event interval (e.g., −1, −2, etc.) prior to the flagged event, and selects a post-event interval (e.g., 1, 2, etc.) after the flagged event. Then, the PQM device 410 selects a communication mechanism (e.g., a user email, or SMS) to report the flagged event and parameters of the flagged event. The RMS and FFT are collected per IEC 61000-4.30 (i.e., 10 cycles at 12 cycles at 60 Hz). RMS and FFT values collected during a sag, swell or interruption are flagged as invalid for aggregation. The PQM device 410 compares the RMS values before and after the flagged intervals to detect a load loss.

Figure 7A:
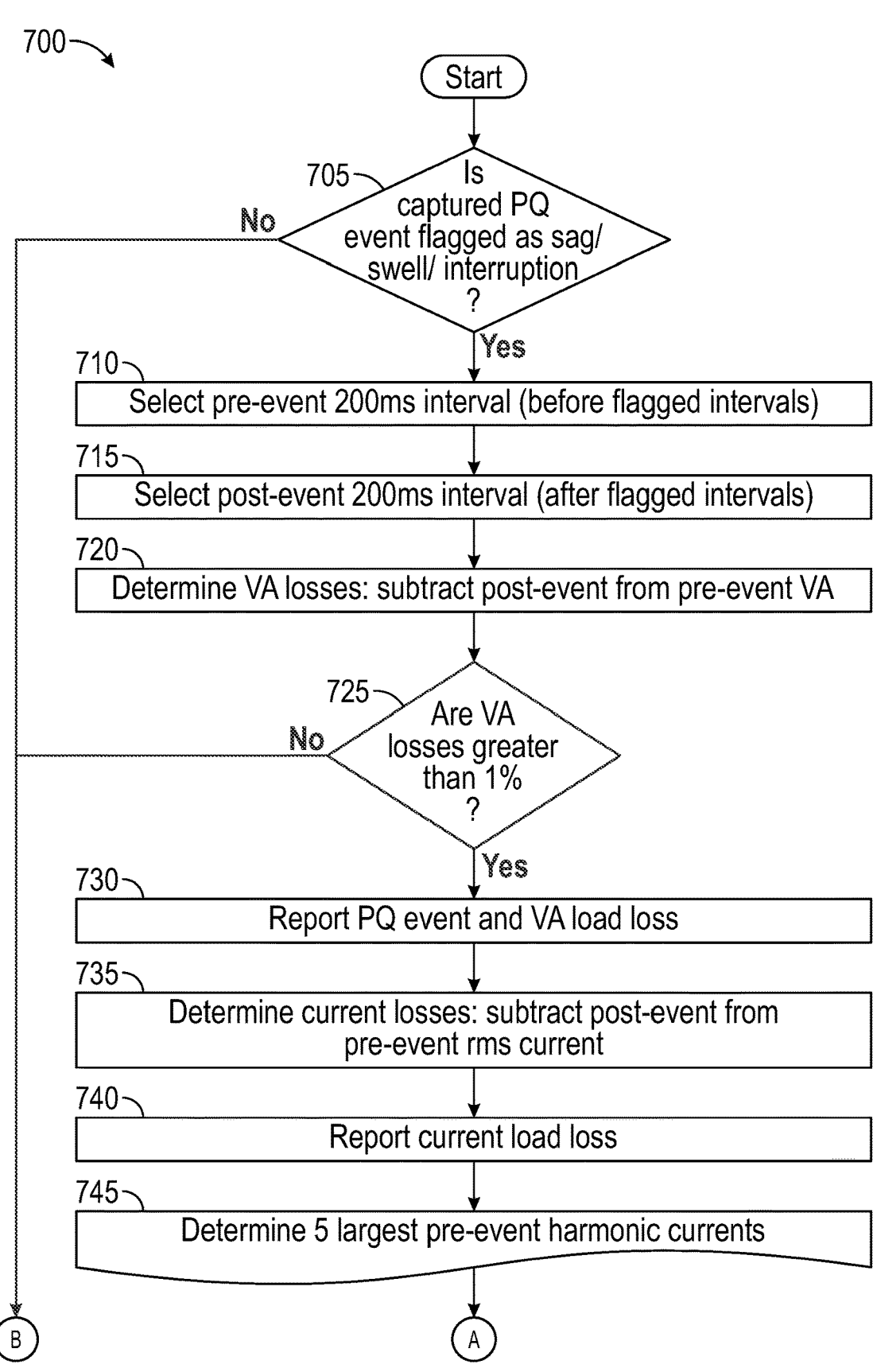
FIGS. 7A-B are a flowchart for a method of power quality monitoring in accordance with an example embodiment of the disclosed concept.
Figure 7B:
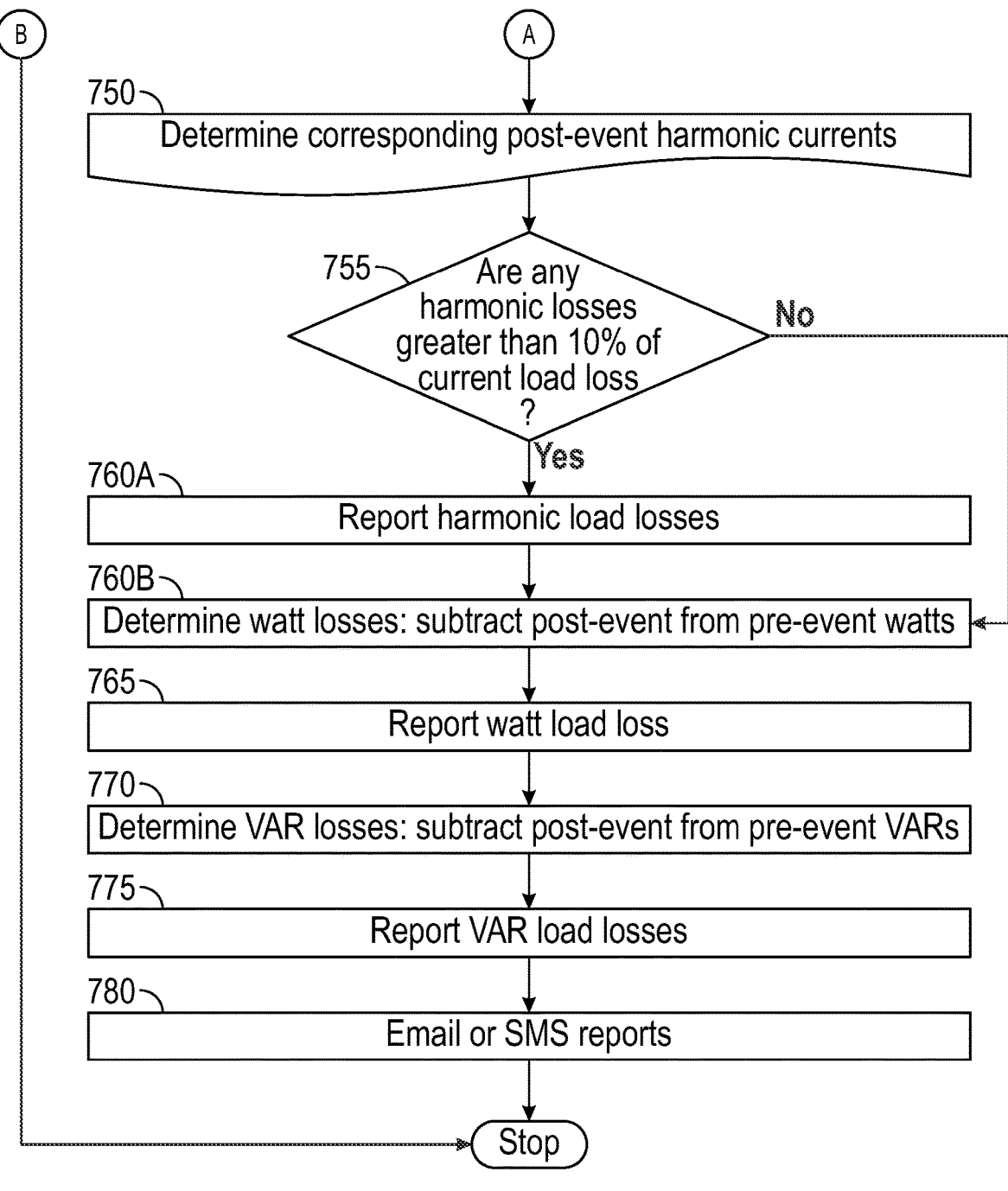

FIGS. 7A-B illustrate a flowchart for method 700 for PQM creation of load loss parameters in accordance with an example embodiment of the disclosed concept. The method 700 may be performed by an intelligent power device 1 or components therein as described with reference to FIGS. 1-3. In FIGS. 7A-B the intelligent power device 1 is illustrated as an intelligent electric meter 1, however, this is for illustrative purposes only and the intelligent power device 1 may be any other type of smart device capable of energy monitoring and power quality monitoring.

At 705, the intelligent electric meter 1 determines whether captured power quality (PQ) event is flagged as a sag, a swell or an interruption. If no, the method 700 stops. If yes, the method 700 proceeds to 710.

At 710, the intelligent electric meter 1 selects pre-event 200 milliseconds (ms) interval (before flagged intervals).

At 715, the intelligent electric meter 1 selects post-event 200 ms interval (after flagged intervals).

At 720, the intelligent electric meter 1 determines volt-ampere (VA) losses by subtracting post-event VA from pre-event VA.

At 725, the intelligent electric meter 1 determines whether the VA losses are greater than 1%. If no, the method 700 stops. If yes, the method 700 proceeds to 730.

At 730, the intelligent electric meter 1 reports the PQ event and the VA load losses to a user.

At 735, the intelligent electric meter 1 determines current load losses by subtracting post-event RMS current from pre-event RMS current.

At 740, the intelligent electric meter 1 reports current load loss.

At 745, the intelligent electric meter 1 determines the five largest pre-event harmonic currents.

At 750, the intelligent electric meter 1 determines corresponding post-event harmonic currents.

At 755, the intelligent electric meter 1 determines whether any harmonic loss is greater than 10% of the current load loss. If yes, at 760A the intelligent electric meter 1 reports the harmonic load loss to the user. If no, at 760B the intelligent electric meter 1 determines Watt load loss by subtracting post-event Watts from pre-event Watts.

At 765, the intelligent electric meter 1 reports the Watt load loss to the user.

At 770, the intelligent electric meter 1 determines VAR load loss by subtracting post-event VARs from pre-event VARs.

At 775, the intelligent electric meter 1 reports the VAR load loss.

At 780, the intelligent electric meter 1 emails or SMS the power quality event report to the user.

Figure 8:
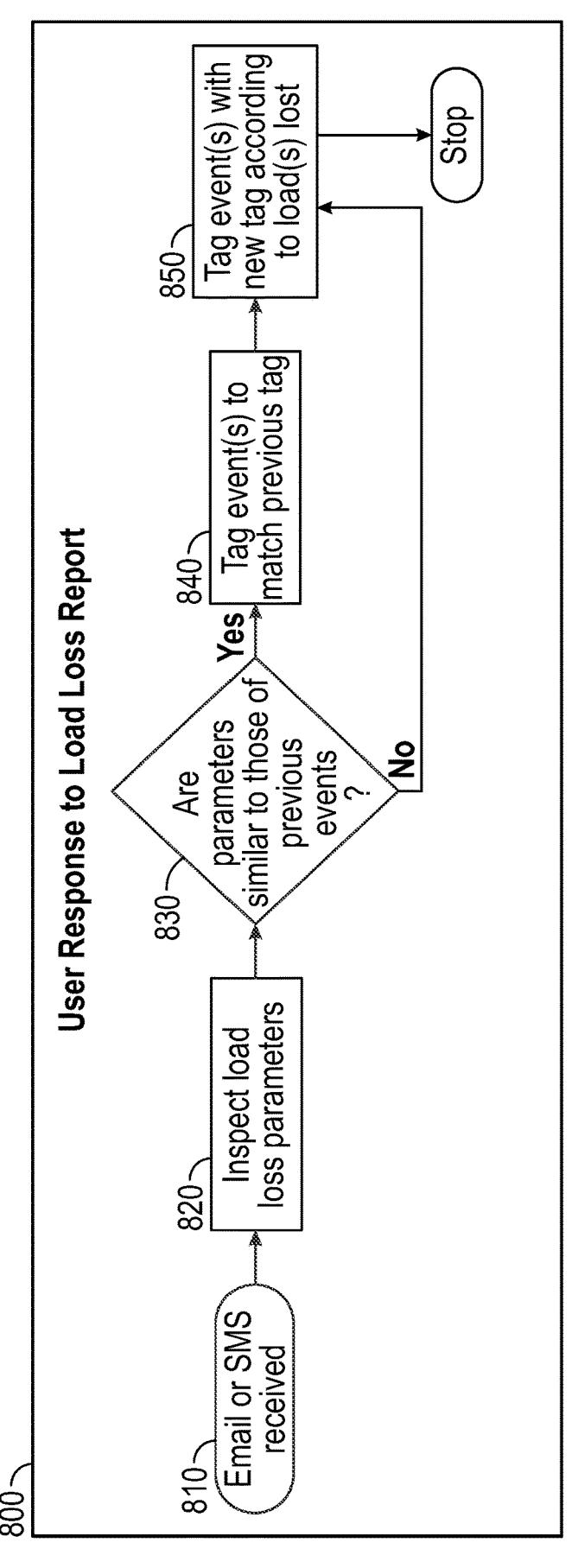
FIG. 8 is a flowchart for a method of power quality monitoring in accordance with an example embodiment of the disclosed concept.

FIG. 8 is a flowchart for a method 800 of user response to load loss report in accordance with an example embodiment of the disclosed concept. The method 800 may be performed by an intelligent power device 1 or components therein as described with reference to FIGS. 1-3. While FIG. 8 shows specific steps of power quality monitoring performed by the user, this is a part of the whole power quality monitoring method in accordance with the present disclosure. In FIG. 8 the intelligent power device 1 is illustrated as an intelligent electric meter 1, however, this is for illustrative purposes only and the intelligent power device 1 may be any other type of smart device capable of energy monitoring and power quality monitoring.

At 810, the user receives an email or SMS including a power quality event report.

At 820, the user inspects the reported load loss parameters.

At 830, the user determines whether the load loss parameters are similar to parameters of previous events.

At 840, the user tags reported power quality event(s) to match a previous tag.

At 850, the user tags the reported power quality event(s) with a new tag according to a load(s) lost.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A method of power quality monitoring of a power system including an intelligent power device coupled to a plurality of loads, comprising:

capturing a power quality event occurring over a part of a plurality of time intervals each having an equal duration, the part spanning one or more time intervals;

determining that the captured power quality event is one of a voltage sag, a swell or an interruption;

in response to determining that the captured power quality event is one of the voltage sag, the swell or the interruption, selecting a pre-event interval comprising one time interval preceding the one or more time intervals and a post-event interval comprising one time interval following the one of more time intervals;

comparing a pre-event load level measured during the pre-event interval and a post-event load level measured during the post-event interval;

detecting a load loss based on a result of the comparison;

transmitting a power quality event report comprising at least the captured power quality event, the detected load loss and load loss parameters associated with the captured power quality event to a user; and in response to detecting the load loss, categorizing the captured power quality event in at least one of a look-up table or an event log within the intelligent power device, wherein the categorizing the captured power quality event comprises:

determining that the load loss parameters associated with the captured power quality event are similar to load loss parameters of a previous power quality event; and in response to determining that the load loss parameters associated with the captured power quality event are similar to the load loss parameters of the previous power quality event, tagging the captured power quality event to match a tag for the previous power quality event, and entering the tagging into at least one of the look-up table or the event log, wherein the tag for the previous power quality event comprises a consequence of the previous power quality event and the consequence includes identity of a load lost as a result of the previous power quality event; or in response to determining that the load loss parameters associated with the captured power quality event are not similar to the load loss parameters of the previous power quality event, generating a new tag for the captured power quality event according to the detected load loss and entering the new tag into at least one of the look-up table or the event log.

2. The method of claim 1, wherein the generating the new tag for the captured power quality event comprises determining identity of a load lost based at least in part on the load loss parameters and energy required for each load of the plurality of loads, and the new tag includes the identity of the load lost.

3. The method of claim 1, wherein the comparing the pre-event load level measured during the pre-event interval and a post-event load level measured during the post-event interval comprising:

establishing a load variation tolerance using a load level measured over at least one time interval preceding the one or more time intervals;

obtaining a difference between the pre-event load level and the post-event load level; and determining that the difference exceeds the established load variation tolerance.

4. The method of claim 3, wherein the obtaining the difference between the pre-event load level and the post-event load level comprises:

subtracting the post-event load level from the pre-event load level.

5. The method of claim 3, wherein detecting the load loss based on the result of the comparison is based on a determination that the difference exceeds the established load variation tolerance.

6. The method of claim 3, wherein the established load variation tolerance comprises voltage-Ampere (VA) load variation tolerance, current load variation tolerance, harmonic load variation tolerance, Watt load variation tolerance, and VA-reactive (VAR) load variation tolerance.

7. The method of claim 6, wherein detecting the load loss based on the result of the comparison comprises:

determining that VA load loss has occurred based on a determination that a difference between pre-event VA measured during the pre-event interval and post-event VA measured during the post-event interval exceeds the VA load variation tolerance;

determining that a current load loss occurred based on a determination that the VA load loss has occurred and a determination that a difference between pre-event current measured during the pre-event interval and post-event current measured during the post-event interval exceeds the current load variation tolerance;

determining a plurality of largest pre-event harmonic currents and corresponding post-event harmonic currents and determining that any of differences between the pre-event harmonic currents and corresponding post-event harmonic currents is greater than the harmonic load variation tolerance comprising a percentage of determined current load loss;

in response to determining that any of differences between the pre-event harmonic currents and corresponding post-event harmonic currents is greater than the harmonic current load variation tolerance, determining that a Watt load loss has occurred based on a determination that a difference between pre-event Watt measured during the pre-event interval and post-event Watt measured during the post-event interval exceeds the Watt load variation tolerance; and in response to determining that a Watt load loss has occurred, determining that a VAR load loss has occurred based on a determination that a difference between pre-event VAR measured during the pre-event interval and post-event VAR measured during the post-event interval exceeds the VAR load variation tolerance.

8. The method of claim 7, wherein the load loss parameters associated with the captured power quality event comprise the VA load loss, the current load loss, the Watt load loss, and the VAR load loss.

9. The method of claim 7, wherein based on the determination that any of differences between the pre-event harmonic currents and corresponding post-event harmonic currents is greater than the harmonic current load variation tolerance, the load loss parameters associated with the captured power quality event comprise the harmonic load loss, the VA load loss, the current load loss, the Watt load loss, and the VAR load loss.

10. The method of claim 6, wherein the VA load variation tolerance is up to one percent of the pre-event VA measured during the pre-event interval.

11. The method of claim 6, wherein the harmonic current load variation tolerance is up to ten percent of the current load loss.

12. The method of claim 1, wherein the equal duration comprises 200 milliseconds.

13. A power quality monitoring system comprising:

a plurality of loads;

a user device; and an intelligent power device coupled to the plurality of loads and structured to monitor power quality and energy within the power quality monitoring system, the intelligent power device comprising a power supply, a display, a metering device, and a controller structured to control power quality and energy monitoring by the intelligent power device, the controller comprising a power quality monitoring device and a communication device communicatively coupled to a user device and the plurality of loads, wherein the power quality monitoring device comprises:

(i) a load loss detector structured to:

capture a power quality event occurring over a part of a plurality of time intervals each having an equal duration, the part spanning one or more time intervals;

determine that the captured power quality event is one of a voltage sag, a swell or an interruption;

in response to determining that the captured power quality event is one of the voltage sag, the swell or the interruption, select a pre-event interval comprising one time interval preceding the one or more time intervals and a post-event interval comprising one time interval following the one of more time intervals;

compare a pre-event load level measured during the pre-event interval and a post-event load level measured during the post-event interval; and detect a load loss based on a result of the comparison;

(ii) a power quality event report generator structured to generate a power quality event report including at least one of the captured power quality event, a detected load loss and load loss parameters associated with the captured power quality event and transmit the power quality event report to the user device via the communication device; and (iii) a look-up table structured to store a plurality of data for use in the power quality and energy monitoring and be accessible by a user for at least one of viewing any of the plurality of data or categorizing the captured power quality event via at least the user device, wherein in comparing the pre-event load level measured during the pre-event interval and a post-event load level measured during the post-event interval, the load loss detector is further structured to:

establish a load variation tolerance using a load level measured over at least one time interval preceding the one or more time intervals;

obtain a difference between the pre-event load level and the post-event load level; and determine that the difference exceeds the established load variation tolerance, wherein the load loss parameters included in the power quality event report comprise voltage-Ampere (VA) load loss, current load loss, harmonic load loss, Watt load loss, and VA-reactive (VAR) load loss.

14. The power quality monitoring system of claim 13, wherein in obtaining the difference between the pre-event load level and the post-event load level, the load loss detector is further structured to subtract the post-event load level from the pre-event load level, and wherein the detecting the load loss based on the result of the comparison is based on a determination that the difference exceeds the established load variation tolerance.

15. The power quality monitoring system of claim 13, wherein the look-up table is accessed by the user for categorizing the captured power quality event based on a determination that the load loss parameters associated with the captured power quality event are similar to load loss parameters of a previous power quality event; and in response to determining that the load loss parameters associated with the captured power quality event are similar to the load loss parameters of the previous power quality event, the captured power quality event is tagged by the user to match a tag fort the previous power quality event, and the tagging is entered into the look-up table, wherein the tag for the previous power quality event comprises a consequence of the previous power quality event and the consequence includes identity of a load lost as a result of the previous power quality event; or in response to determining that the load loss parameters associated with the captured power quality event are not similar to the load loss parameters of the previous power quality event, a new tag for the captured power quality event is generated according to the detected load lost and the new tag is entered into the look-up table.

16. The method of claim 15, wherein the new tag includes identity of a load lost determined based at least in part on the load loss parameters and energy required for each load of the plurality of loads.

* * * * *